US012785722B2

(12) United States Patent
Graumann et al.

(10) Patent No.: US 12,785,722 B2
(45) Date of Patent: Nov. 3, 2026

(54) EARLY EXIT ERROR-LOCATOR POLYNOMIAL DETERMINATION

(71) Applicant: Microchip Technology Incorporated, Chandler, AZ (US)

(72) Inventors: Peter Graumann, Calgary (CA); Chandra Varanasi, Broomfield, CO (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 18/541,990

(22) Filed: Dec. 15, 2023

(65) Prior Publication Data

US 2024/0204802 A1 Jun. 20, 2024

Related U.S. Application Data

(60) Provisional application No. 63/387,639, filed on Dec. 15, 2022.

(51) Int. Cl.
*H03M 13/15* (2006.01)

(52) U.S. Cl.
CPC ..... *H03M 13/1575* (2013.01); *H03M 13/151* (2013.01); *H03M 13/1545* (2013.01); *H03M 13/153* (2013.01)

(58) Field of Classification Search
CPC ........... H03M 13/1575; H03M 13/151; H03M 13/1545
See application file for complete search history.

(56) References Cited

U.S. PATENT DOCUMENTS

| | | | | |
|---|---|---|---|---|
| 5,541,939 | A * | 7/1996 | Im | H03M 13/151 714/755 |
| 5,878,058 | A | 3/1999 | Im | |
| 6,023,782 | A | 2/2000 | Cox et al. | |
| 6,061,826 | A | 5/2000 | Thirumoorthy et al. | |
| 6,131,178 | A * | 10/2000 | Fujita | H03M 13/1535 714/784 |
| 6,286,123 | B1 | 9/2001 | Kim | |
| 6,446,233 | B1 | 9/2002 | Dadurian | |
| 6,662,332 | B1 * | 12/2003 | Kimmitt | H03M 13/276 714/704 |
| 7,454,690 | B1 | 11/2008 | Au et al. | |
| 7,613,988 | B1 | 11/2009 | Wu et al. | |
| 7,870,468 | B1 | 1/2011 | Vanka et al. | |

(Continued)

FOREIGN PATENT DOCUMENTS

WO 00/28668 5/2020

OTHER PUBLICATIONS

Hong-Fu Chou, Early-Stopped Approach and Analysis for the Berlekamp-Massey Algorithm, Interdisciplinary Centre for Security, Reliability and Trust, University of Luxembourg, Sep. 13, 2022, pp. 1-4.

(Continued)

*Primary Examiner* — Joseph D Torres
(74) *Attorney, Agent, or Firm* — TraskBritt

(57) ABSTRACT

A method may include generating a status signal, the status signal to indicate a status of Error-Locator-Polynomial (ELP) determination by an ELP determination circuit; and controlling the ELP determination by the ELP determination circuit at least partially responsive to a value of the status signal.

20 Claims, 11 Drawing Sheets

(56) References Cited

U.S. PATENT DOCUMENTS

| | | | | |
|---|---|---|---|---|
| 9,037,941 | B2 * | 5/2015 | Dong | G06F 11/1012 714/755 |
| 2003/0097632 | A1 | 5/2003 | Marconetti | |
| 2003/0192007 | A1 | 10/2003 | Miller et al. | |
| 2008/0069118 | A1 * | 3/2008 | Monier | H04B 17/318 370/400 |
| 2008/0270961 | A1 | 10/2008 | Mead | |
| 2011/0107188 | A1 * | 5/2011 | Dror | H03M 13/152 714/752 |
| 2011/0239094 | A1 | 9/2011 | Kwok et al. | |
| 2016/0026435 | A1 | 1/2016 | Hung et al. | |
| 2016/0103735 | A1 * | 4/2016 | Lee | H03M 13/1545 714/764 |
| 2017/0093433 | A1 * | 3/2017 | Ilani | H03M 13/153 |
| 2018/0060160 | A1 | 3/2018 | Fang et al. | |
| 2018/0189237 | A1 | 7/2018 | Werner et al. | |
| 2019/0068319 | A1 | 2/2019 | Shany et al. | |
| 2023/0299794 | A1 | 9/2023 | Kokubun et al. | |

OTHER PUBLICATIONS

International Search Report of International Application No. PCT/US2023/084422, mailed May 13, 2024, 5 pages.

James L. Massey, Shift-Register Synthesis and BCH Decoding, IEEE Transactions on Information Theory, IEEE, vol. IT-15, No. 1, Jan. 1969, pp. 122-127.

Written Opinion of the International Searching Authority of International Application No. PCT/US2023/084422, mailed May 13, 2024, 11 pages.

Yin, M. et al., Optimized algorithms for binary BCH codes, Circuits and Systems (ISCAS), 2013 IEEE International Symposium, IEEE, 2013-5-19, pp. 1552-1555.

C.L. Chen, High-Speed Decoding of BCH Codes, IEEE Transactions on Information Theory, vol. IT-27, No. 2, Mar. 1, 1981, pp. 254-256, DOI: 10.1109/TIT.1981.1056312.

International Search Report of International Application No. PCT/US2024/020788, mailed May 29, 2024, 7 pages.

Written Opinion of the International Search Authority of International Application No. PCT/US2024/020788, mailed May 29, 2024, 11 pages.

Yingquan Wu, New Scalable Decode Architectures for Reed-Solomon Codes, IEEE Transaction on Communications, IEEE Service Center, vol. 63, No. 8, 2015-8-1, pp. 2741-2761, DOI: 10.1109/TCOMM.2015.2445759.

A. Koohi, Nader Bagherzadeh and Chengzi Pan, "A fast parallel Reed-Solomon decoder on a reconfigurable architecture," First IEEE/ACM/IFIP International Conference on Hardware/ Software Codesign and Systems Synthesis (IEEE Cat. No. 03TH8721), Newport Beach, CA, USA, 2003.

* cited by examiner

EARLY EXIT ERROR-LOCATOR POLYNOMIAL DETERMINATION

CROSS-REFERENCE TO RELATED APPLICATION

This application claims the benefit under 35 U.S.C. § 119(e) of the priority date of U.S. Provisional Patent Application Ser. No. 63/387,639 filed Dec. 15, 2022, entitled "EARLY EXIT FROM ERROR-LOCATOR POLYNOMIAL CALCULATION," the contents and disclosure of which is incorporated herein in its entirety by this reference.

FIELD

Examples relate, generally, to determining error-locator polynomials and decoders that utilize the same. More specifically, one or more examples relate to early exit from an ELP determination based on the status of the ELP determination. In one or more examples, if determined that the estimated ELP is the final ELP then further iterations of the ELP determination can be omitted.

BACKGROUND

An error locator polynomial (ELP) is a polynomial expression where the roots of the expression represent the error pattern in a block of data. ELPs are utilized in a variety of operational contexts, including Reed Solomon (RS) decoders and Bose-Chaudhuri-Hocquenghem (BCH) decoders.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

Figure 1:
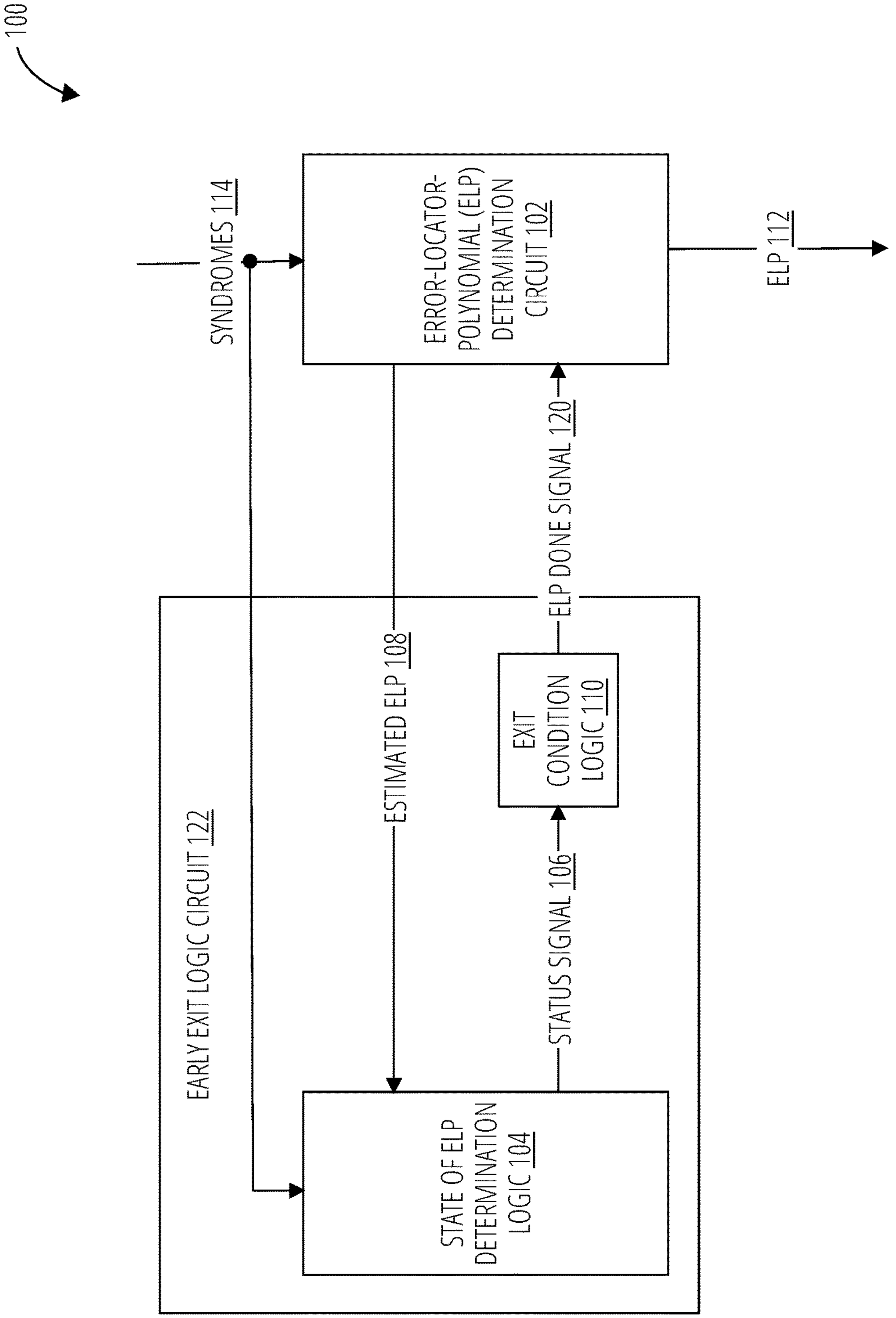
FIG. 1 is a block diagram depicting an apparatus for determining an Error-Locator-Polynomial (ELP) at least partially based on a status signal, where the status signal indicates the status of an ELP determination, in accordance with one or more examples.

In the following detailed description, reference is made to the accompanying drawings, which form a part hereof, and in which are shown, by way of illustration, specific examples of examples in which the present disclosure may be practiced. These examples are described in sufficient detail to enable a person of ordinary skill in the art to practice the present disclosure. However, other examples may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example of this disclosure to the specified components, steps, features, functions, or the like.

It will be readily understood that the components of the examples as generally described herein and illustrated in the drawing could be arranged and designed in a wide variety of different configurations. Thus, the following description of various examples is not intended to limit the scope of the present disclosure, but is merely representative of various examples. While the various aspects of the examples may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, without limitation. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, any relational term, such as "over," "under," "on," "underlying," "upper," "lower," without limitation, is used for clarity and convenience in understanding the disclosure and accompanying drawings and does not connote or depend on any specific preference, orientation, or order, except where the context clearly indicates otherwise.

In this description the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The term "connected" may be used in this description interchangeably with the term "coupled," and has the same meaning unless expressly indicated otherwise or the context would indicate otherwise to a person having ordinary skill in the art.

A typical approach to solve for the error locator polynomial (ELP) is to complete all 2*t iterations of a Berlekamp-Massey ("Berlekamp") algorithm, where t is the highest number of errors correctable by a respective instance of the Berlekamp algorithm. The Berlekamp algorithm continues evolving an ELP even after converging on an ELP.

This allows the ELP determination to have consistent latency (e.g., always have the same latency, without limitation), which reduces the burden of integration into any overall circuit flow within a device. Typical RS decoders try and maintain consistent latency regardless of the number of errors in a Forward Error Corrected (FEC) data block ("FEC block"). In real system operation, those FEC blocks that have a low number of errors (0 or 1 symbols that are erred) are the most common while those that have t or t−1 errors are rare. Nevertheless, a standard Reed Solomon decoder typically must maintain full system throughput even for the FEC blocks that have t or t−1 errors.

The latency of a typical RS decoder is typically related to the highest number of errors that could be corrected by the decoder for a given application. The ELP calculation generally utilizes 2*t iterations to complete, where t is the highest error correction capacity of the decoder. For latency critical systems, it is desirable to reduce the RS decoder latency.

During respective iterations of an ELP determination, the Berlekamp algorithm determines a discrepancy value (also referred to herein as a "Berlekamp discrepancy value") that represents a difference between the error pattern detectable by a current version of the ELP (respective current versions of an ELP over various iterations are referred to herein as an "estimated ELP" or a "respective ELP") and an error pattern indicated by a syndrome.

If the discrepancy value at any iteration is zero and all future discrepancy values are zero then the estimated ELP is the final ELP. If the state of the ELP determination is stable at an iteration earlier than the 2*t iteration, it may be desirable to exit the ELP determination before performing all 2*t iteration of the Berlekamp algorithm.

One or more examples relate, generally, to determining an early exit condition for a Berlekamp algorithm. an estimated ELP is utilized to determine whether or not a totality of discrepancy values for later iterations of the Berlekamp algorithm will be zero.

An ELP determination block or RS decoder including the same that offers early exit discussed herein may exhibit reduced latency (e.g., time duration from input of a codeword to corresponding output, without limitation). For example, if the number of errors is v, the latency of the ELP determination with early exit option is 2*v instead of 2*t as in the typical case.

FIG. 1 is a block diagram depicting an apparatus 100 for determining an Error-Locator-Polynomial (ELP) at least partially based on a status signal, where the status signal indicates the status of ELP determination, in accordance with one or more examples.

The apparatus 100 includes an ELP determination circuit 102 and an early exit logic circuit 122. Early exit logic circuit 122 includes a state of ELP determination logic 104 and an exit condition logic 110.

In one or more examples, ELP determination circuit 102 generates an ELP 112 at least partially based on an syndromes 114. ELP determination circuit 102 receives syndromes 114, determines an ELP 112 associated with the syndromes 114, and provides the determined ELP 112. A "codeword" is a sequence of symbols. ELP determination circuit 102 determines an ELP 112 based on syndromes 114 having coefficients that indicate the locations of the one or more of the errors in a codeword associated with syndromes 114, as discussed below. An "error" is a difference between the current form of a codeword and the original or intended form of the codeword. Non-limiting examples of errors include symbol errors, burst errors, or erasure errors, without limitation. Such differences may be caused, as non-limiting examples, during transmission (e.g., via an electronic communication system, without limitation) or storage (e.g., via a data storage device, without limitation) of a codeword associated with syndromes 114.

In one or more examples, syndromes 114 is a vector of syndromes (e.g., a vector of syndromes includes one or more syndromes, without limitation). Syndromes 114 indicate the presence of errors (and implicitly or explicitly the absence of errors) in a codeword and the locations of the errors in the codeword. The locations of errors in a codeword may also be referred to herein as an "error pattern." Respective syndromes correspond to respective, specific error patterns. For a given code (e.g., FEC encoding technique, without limitation) that can correct up to t errors, 2*t syndromes 114 are determined on a codeword.

Respective syndromes 114 may be received from a syndrome calculator (syndrome calculator not depicted). ELP determination circuit 102 determines ELP 112 over one or more iterations at least partially based on the syndromes 114. The coefficients of ELP 112 are set so the locations of errors in the codeword associated with syndromes 114 may be determined at least partially based thereon, as discussed below.

In one or more examples, ELP determination circuit 102 may determine ELP 112 at least partially based on a Berlekamp algorithm. During an ELP determination, the Berlekamp algorithm iteratively refines an ELP, including changing the coefficients of the ELP. The Berlekamp algorithm takes 2*t iterations to finalize ELP determination. By the end of the ith iteration the Berlekamp algorithm has evolved (e.g., changed, without limitation) the ELP such that the discrepancy value ($V*ELP-S_i$)=0, where $S_i$ is the ith syndrome, syndromes (e.g., syndromes 114, without limitation) is a vector of v syndromes $[S_{i-1}\ S_{i-2}, \ldots, S_{i-v}]$ denoted by their subscripts, and the ELP (e.g., ELP 112, without limitation) is a vector of v coefficients $[\sigma_1, \sigma_2, \ldots, \sigma_v]$ of the ELP.

During respective iterations, the Berlekamp algorithm determines discrepancy values (also referred to herein as a "Berlekamp discrepancy value") that represent a difference between an error pattern indicated by a current version of the ELP (the current version of an ELP over various iterations may also be referred to herein as an "estimated ELP") and an error pattern indicated by the syndromes 114. As a non-limiting example, a discrepancy value of zero indicates no difference, a discrepancy value that is non-zero indicates a difference. A zero-discrepancy value implies that all errors represented by a current syndrome are detectable by the estimated ELP. A non-zero discrepancy value implies that all errors represented by a current syndrome are not detectable by the estimated ELP.

The Berlekamp algorithm changes the coefficients of the estimated ELP to account for the discrepancy values, i.e., to reduce the difference between the error patterns indicated by the estimated ELP and error patterns indicated by the syndromes 114. The iterative process continues until the Berlekamp algorithm converges on an ELP that accurately detects the error patterns indicated by the syndromes 114. When the Berlekamp algorithm of ELP determination circuit 102 determines that an estimated ELP accurately detects the error patterns indicated by syndromes 114, then the Berlekamp algorithm does not change the coefficients of the estimated ELPs. In one or more examples, ELP determination circuit 102 may stop changing the coefficients of the ELP and provide it as ELP 112 in response to completing all 2*t iterations of a Berlekamp algorithm, or in response to assertion of ELP done signal 120 whether or not all 2*t iterations of the Berlekamp algorithm are complete, as discussed below. The ELP 112 may be utilized to locate and correct errors in a codeword associated with syndromes 114. As a non-limiting example, the reciprocal roots of coefficients of ELP 112 indicate the locations of errors in the codeword, thus, as a non-limiting example, a correction circuit (correction circuit not depicted by FIG. 1) may determine the reciprocal roots of ELP 112 and apply error correction to the locations in the codeword indicated by the roots of the ELP 112.

Early exit logic circuit 122 receives syndromes 114 and estimated ELP 108 and sets ELP done signal 120 at least partially based thereon. The exit condition logic 110 of early exit logic circuit 122 controls an ELP determination at ELP determination circuit 102 via ELP done signal 120. When asserted, ELP done signal 120 instructs ELP determination circuit 102 to stop the estimated ELP determination (whether or not all 2*t iterations of the Berlekamp algorithm are complete), and when de-asserted the ELP done signal 120 instructs ELP determination circuit 102 that an estimated ELP determination may continue. Exit condition logic 110 sets ELP done signal 120 (e.g., to asserted or de-asserted, without limitation) at least partially responsive to a value of status signal 106. Status signal 106 indicates the status of an ELP determination at ELP determination circuit 102. In one or more examples, a first value represents a stable state, and a second, different value, represents a non-stable state. In one or more examples, exit condition logic 110 may instruct a conditional exit from an ELP determination via ELP done signal 120. The exit condition logic 110 may assert ELP done signal 120 at least partially in response to a first value of the status signal 106 that indicates the ELP determination has reached a stable state, and may de-assert ELP done signal 120 at least partially in response to a second, different value of the status signal 106 that indicates the ELP determination has not reached a stable state. In response to exit condition logic 110 asserting ELP done signal 120, ELP determination circuit 102 stops an ELP determination, and provides the estimated ELP as the ELP 112 for the syndromes 114.

State of ELP determination logic 104 receives an estimated ELP 108 from ELP determination circuit 102 and the syndromes 114. Estimated ELP 108 is an estimated ELP determined by ELP determination circuit 102 associated with a specific iteration of an estimated ELP determination being performed at ELP determination circuit 102.

State of ELP determination logic 104 receives determines a status of an ELP determination of the ELP determination circuit 102 at least partially, and sets status signal 106 at least partially based on the determined status of the ELP determination, as discussed below. Generally speaking, state of ELP determination logic 104 determines if an ELP determination by the ELP determination circuit 102 is, or is not, in a stable state. In one or more examples, state of ELP determination logic 104 may determine that an ELP determination is in a stable state in response to determining that no changes to the coefficients of the estimated ELP will occur in further (e.g., future, without limitation) iterations of the ELP determination, as discussed below. State of ELP determination logic 104 sets status signal 106 to a value that represents the determined status of the ELP determination, sets status signal 106 to the first value that indicates the ELP determination is in a stable state, and sets status signal 106 to the second different value to indicate the ELP determination is in a non-stable state.

FIG. 1 depicts ELP determination circuit 102 and early exit logic circuit 122 in separate logical blocks, but this is not intended to limit the disclosure in any way. In one or more examples, One or both of state of ELP determination logic 104 and exit condition logic 110 may be or form a portion of the logic circuit of ELP determination circuit 102, or may be or form a portion of a separate logic circuit with one or more connections (e.g., one or more pins, terminals, wires, data paths, without limitation) between state of ELP determination logic 104 and ELP determination circuit 102 and state of ELP determination logic 104 for communicating Estimated ELP 108 and status signal 106.

In respective iterations, the Berlekamp algorithm of ELP determination circuit 102 determines the estimated ELP 108 for a respective iteration, and provides the estimated ELP 108 to early exit logic circuit 122 and, more specifically, to state of ELP determination logic 104. In one or more examples, state of ELP determination logic 104 determines discrepancy values for current and subsequent iterations of the ELP determination based on the syndromes 114 and estimated ELP 108, determines whether or not a totality of the determined discrepancy values are zero, and determines a value to set status signal 106 based on whether or not a totality of the discrepancy values are zero.

Figure 2:
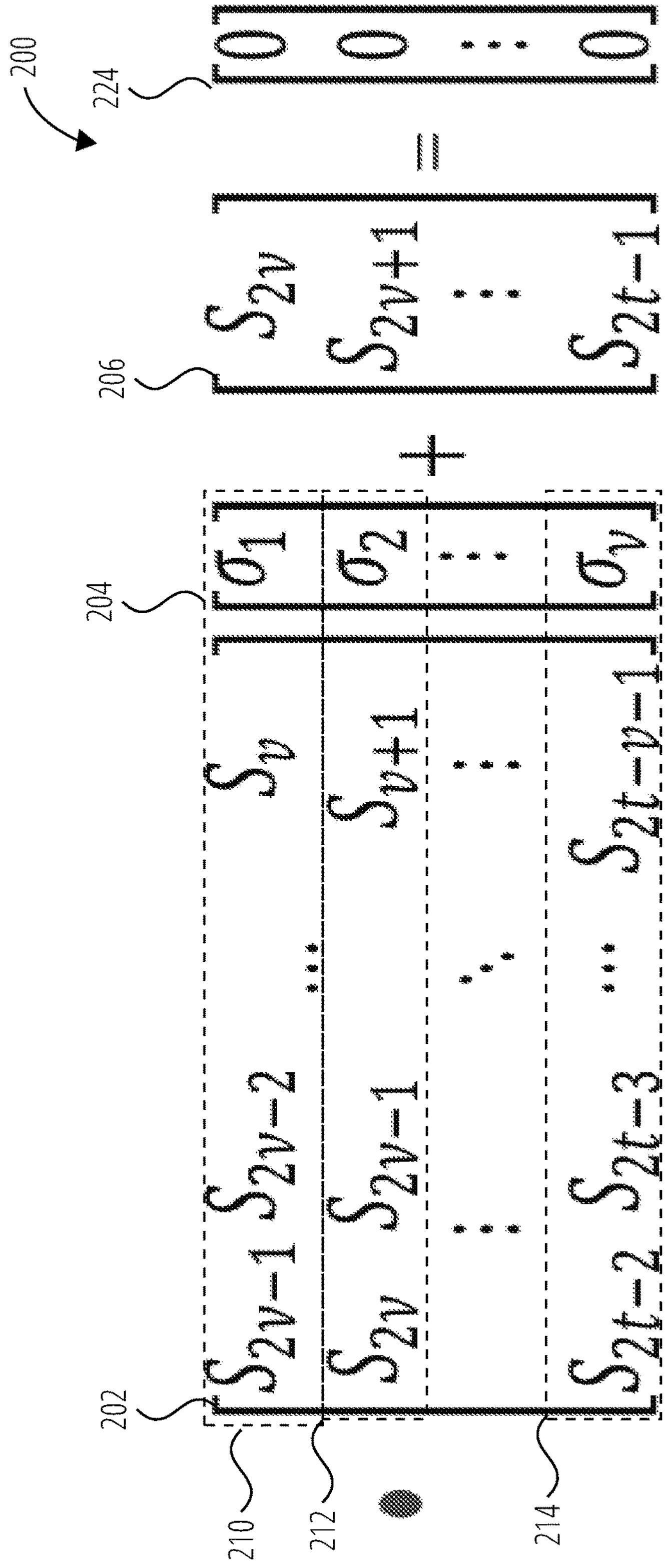
FIG. 2 depicts a matrix equation for determining discrepancy values in accordance with one or more examples.

FIG. 2 depicts an expression 200 that represents a discrepancy value analysis, in accordance with one or more examples. In one or more examples, state of ELP determination logic 104 may determine discrepancy values according to expression 200, and utilize the determined discrepancy values to determine the status of an ELP determination. Expression 200 includes a matrix 202 including (2*t−2*v) rows, where a respective row 210, 212 . . . 214 includes syndromes (taken from syndromes 114); a matrix 204 of coefficients $\sigma_1$ to $\sigma_v$ of estimated ELP 108; a matrix 206 of syndromes 114; and a matrix 224 of discrepancy values. The result of multiplying matrix 202 with matrix 204 is a matrix of values.

The result of multiplying matrix 202 with matrix 204 is added (denoted by the "+" in FIG. 2) to the values in matrix 206, and if the values are the same then the result will be zero values in matrix 224. If the values are different then the result will be non-zero values in matrix 224. In this specific example, the addition operation refers to verifying whether or not two quantities are the same.

If the quantities are the same then the discrepancy values in matrix 224 are 0, otherwise the discrepancy values is non-zero. The expression 200 in FIG. 2 depicts a contemplated, non-limiting, example where the determined discrepancy values are all zeros. Here, 'v' is an integrate greater than or equal to 1, and also represents a current iteration being evaluated by state of ELP determination logic 104.

In one or more examples, estimated ELPs determined by ELP determination circuit 102 at even iterations of a respective ELP determination are provided to early exit logic circuit 122, and estimated ELPs determined during odd iterations of the respective ELP determination are not (e.g., are never, without limitation) provided to early exit logic circuit 122. This is because the number of iterations to determine a correct ELP is at least twice the number of errors present in a codeword, so a correct ELP will be determined on an even iteration of the Berlekamp algorithm. In one or more examples, the iterations evaluated by expression 200 are the totality of even iterations from current iteration v to final iteration t by state of ELP determination logic 104 utilizing the estimated ELP 108 and syndromes 114. If a totality of discrepancy values are zero for all such even iterations from v to t, then state of ELP determination logic 104 sets the status signal 106 to indicate the stable state of the ELP determination, and if there are any non-zero discrepancy values then state of ELP determination logic 104 sets the status signal 106 to indicate the non-stable state of the ELP determination.

As a non-limiting example, for a syndrome vector S and an estimated ELP C with degree L the Berlekamp discrepancy value at an nth iteration of a Berlekamp algorithm may be expressed as follows:

For n=0:13 (L=1, using 14 multipliers) the discrepancy value is given via Equation 1:

$$dn = C[0]*S[n+1]+S[n+2] \quad \text{(Equation 1)}$$

For n=0:11 (L=2, using 24 multipliers) the discrepancy value is given via Equation 2:

$$dn = C[1]*S[n+2]+C[0]*S[n+3]+S[n+4] \quad \text{(Equation 2)}$$

For n=0:9 (L=3, using 30 multipliers) the discrepancy value is given via Equation 3:

$$dn = C[2]*S[n+3]+C[1]*S[n+4]+C[2]*S[n+5]+S[n+6] \quad \text{(Equation 3)}$$

For n=0:7 (L=4, using 32 multipliers) the discrepancy value is given via Equation 4:

$$dn = C[3]*S[n+4]+C[2]*S[n+5]+C[1]*S[n+6]+C[0]*S[n+7]+S[n+8] \quad \text{(Equation 4)}$$

For n=0:5 (L=5, 30 multipliers) the discrepancy value is given via Equation 5:

$$dn = C[4]*S[n+5] + C[3]*S[n+6] + C[3]*S[n+7] + C[1]*S[n+8] + C[0]*S[n+9] + S[n+10] \quad \text{(Equation 5)}$$

By way of non-limiting example, if the current iteration is n=2 and the estimated ELP is an ELP having a degree 1, the discrepancy values dn for n=0 to 13 are determined according to Equation 1. If a totality of the discrepancy values are zero, then an error pattern represented by the syndrome vector S is detectable by the estimated ELP. This determination is performed utilizing the estimated ELP 108 and syndromes 114 for the current and subsequent iterations. If a totality of discrepancy values are zero then state of ELP determination logic 104 determines the ELP determination has a stable state and sets the status signal 106 to indicate the same. If any of the discrepancy values are non-zero then state of ELP determination logic 104 determines the ELP determination has a non-stable state and sets the status signal 106 to indicate the same.

In one or more examples, state of ELP determination logic 104 may determine discrepancy values for respective iterations in parallel (e.g., during a substantially the same time duration, during the same iteration of the Berlekamp algorithm at ELP determination circuit 102, during a same clock cycle, same series of clock cycles, without limitation). In one or more examples, respective determinations of discrepancy values for rows 210, 212, . . . 214 of matrix 202, may occur in parallel. In one or more examples, the respective determinations may be performed in parallel. In one or more examples, a bank of multipliers (and optionally summers, inverters, without limitation) may be provided at state of ELP determination logic 104 and used to perform respective discrepancy value determinations in parallel. By way of non-limiting example, determining in parallel reduces the time (and so reduces latency) utilized by the state of ELP determination logic 104 to determine the status of the ELP determination as compared to determining sequentially. In one or more examples, a parallel determinations of discrepancy values may occur during (e.g., substantially entirely during, without limitation) odd iterations of an ELP determination at ELP determination circuit 102 that immediately follows the even iteration that generated the estimated ELP 108 being used by the state of ELP determination logic 104.

Figure 3:
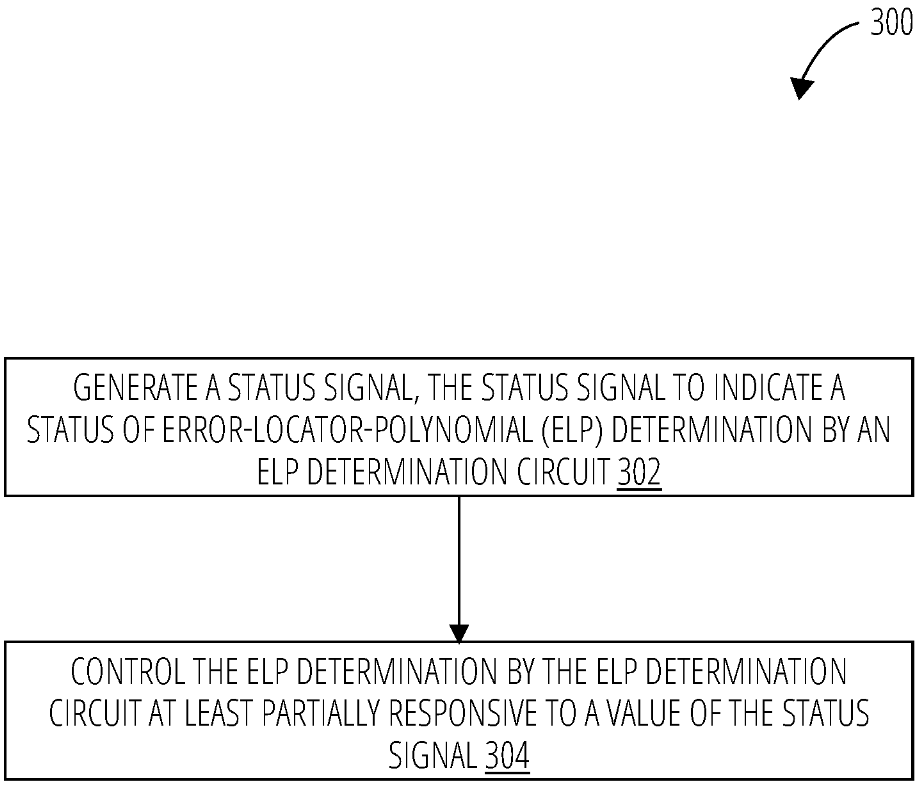
FIG. 3 is a flowchart depicting a process for determining an Error-Locator-Polynomial (ELP) at least partially based on a status signal, in accordance with one or more examples.

FIG. 3 is a flowchart depicting a process 300 for determining an Error-Locator-Polynomial (ELP) at least partially based on a status signal, in accordance with one or more examples.

Although the example process 300 depicts a particular sequence of operations, the sequence may be altered without departing from the scope of the present disclosure. For example, some of the operations depicted may be performed in parallel or in a different sequence that does not materially affect the function of the process 300. In other examples, different components of an example device or system that implements the process 300 may perform functions at substantially the same time or in a specific sequence. Some or a totality of operations of process 300 may be performed, as non-limiting examples, by one or more of apparatus 100, ELP determination circuit 102, exit condition logic 110, or state of ELP determination logic 104.

According to one or more examples, process 300 may include generating a status signal, the status signal to indicate a status of error-locator-polynomial (ELP) determination by an ELP determination circuit at operation 302.

According to one or more examples, process 300 may include controlling the ELP determination by the ELP determination circuit at least partially responsive to a value of the status signal at operation 304.

Figure 4:
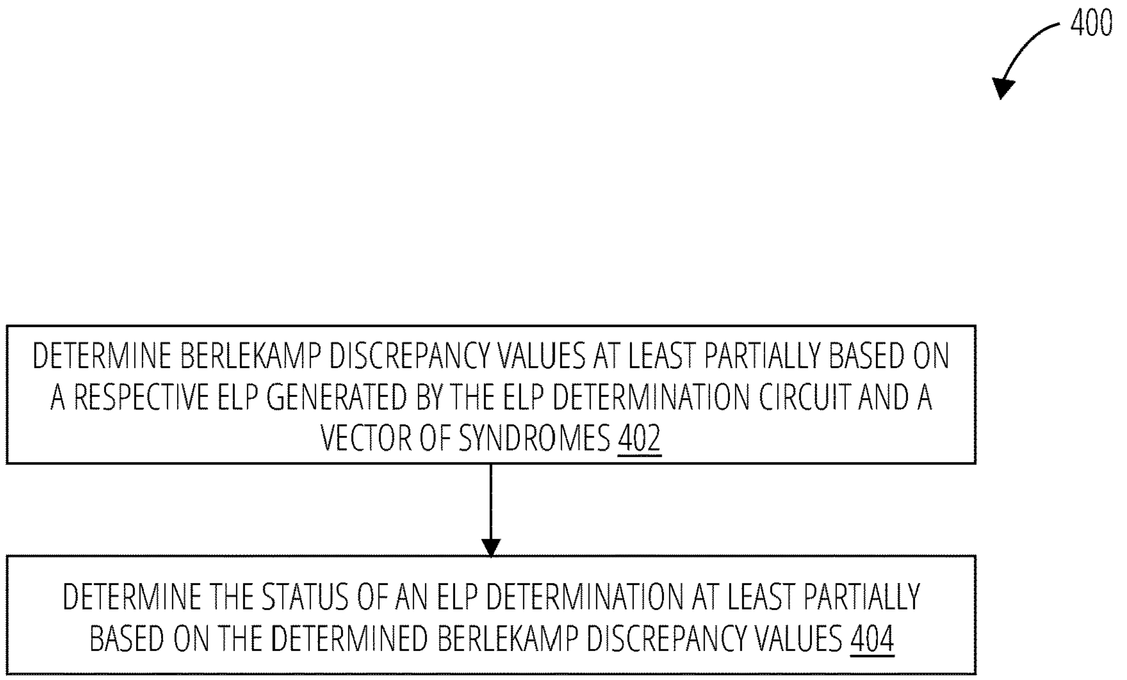
FIG. 4 is a flowchart depicting a process for determining the status of an ELP determination, in accordance with one or more examples.

FIG. 4 is a flowchart depicting a process 400 for determining the status of an ELP determination, in accordance with one or more examples.

Although the example process 400 depicts a particular sequence of operations, the sequence may be altered without departing from the scope of the present disclosure. For example, some of the operations depicted may be performed in parallel or in a different sequence that does not materially affect the function of the process 400. In other examples, different components of an example device or system that implements the process 400 may perform functions at substantially the same time or in a specific sequence. Some or a totality of operations of process 300 may be performed, as non-limiting examples, by one or more of apparatus 100, ELP determination circuit 102, or state of ELP determination logic 104.

According to one or more examples, process 400 may include determining Berlekamp discrepancy values (e.g., determining Berlekamp discrepancy values via expression 200 of FIG. 2, without limitation) at least partially based on a respective ELP generated by the ELP determination circuit (e.g., an estimated ELP 108 of FIG. 1, without limitation) and a vector of syndromes (e.g., syndromes 114 of FIG. 1, without limitation), at operation 402.

According to one or more examples, process 400 may include determining the status of an ELP determination at least partially based on the determined Berlekamp discrepancy values, at operation 404. As discussed above, if a totality of discrepancy values are zero values than the status of the ELP determination may be determined to be stable state, and if any of the discrepancy values are non-zero values then the status of the ELP determination may be determined to be a non-stable state.

Figure 5:
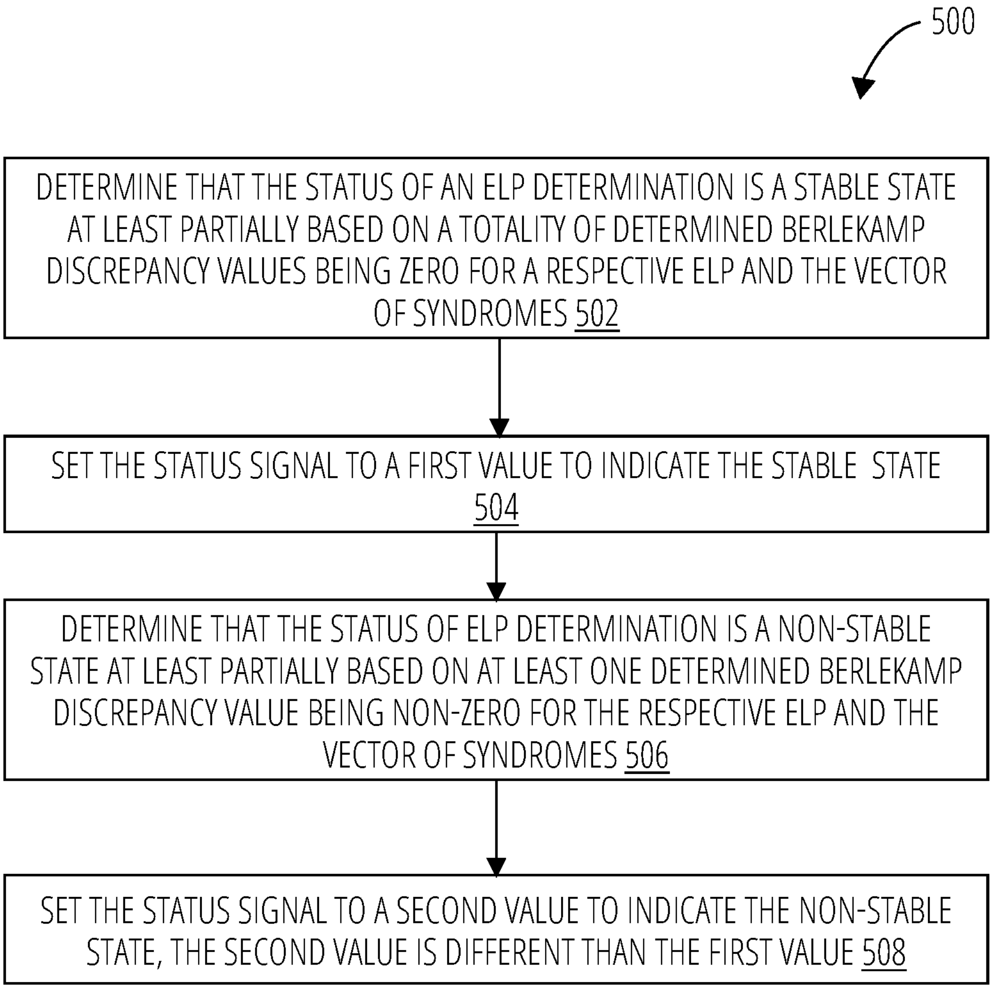
FIG. 5 is a flowchart depicting a process for setting a status signal that indicates the status of an ELP determination, in accordance with one or more examples.

FIG. 5 is a flowchart depicting a process 500 for setting a status signal that indicates the status of an ELP determination, in accordance with one or more examples.

Although the example process 500 depicts a particular sequence of operations, the sequence may be altered without departing from the scope of the present disclosure. For example, some of the operations depicted may be performed in parallel or in a different sequence that does not materially affect the function of the process 500. In other examples, different components of an example device or system that implements the process 500 may perform functions at substantially the same time or in a specific sequence. Some or a totality of operations of process 300 may be performed, as non-limiting examples, by one or more of apparatus 100, ELP determination circuit 102, exit condition logic 110, or state of ELP determination logic 104.

According to one or more examples, process 500 may include determining that the status of an ELP determination is a stable state at least partially based on a totality of determined Berlekamp discrepancy values being zero for a respective ELP and the vector of syndromes at operation 502.

According to one or more examples, process 500 may include setting the status signal to a first value to indicate the stable state at operation 504.

According to one or more examples, process 500 may include determining that the status of ELP determination is a non-stable state at least partially based on at least one determined Berlekamp discrepancy value being non-zero for the respective ELP and the vector of syndromes at operation 506.

According to one or more examples, process 500 may include setting the status signal to a second value to indicate the non-stable state, the second value is different than the first value at operation 508.

Figure 6:
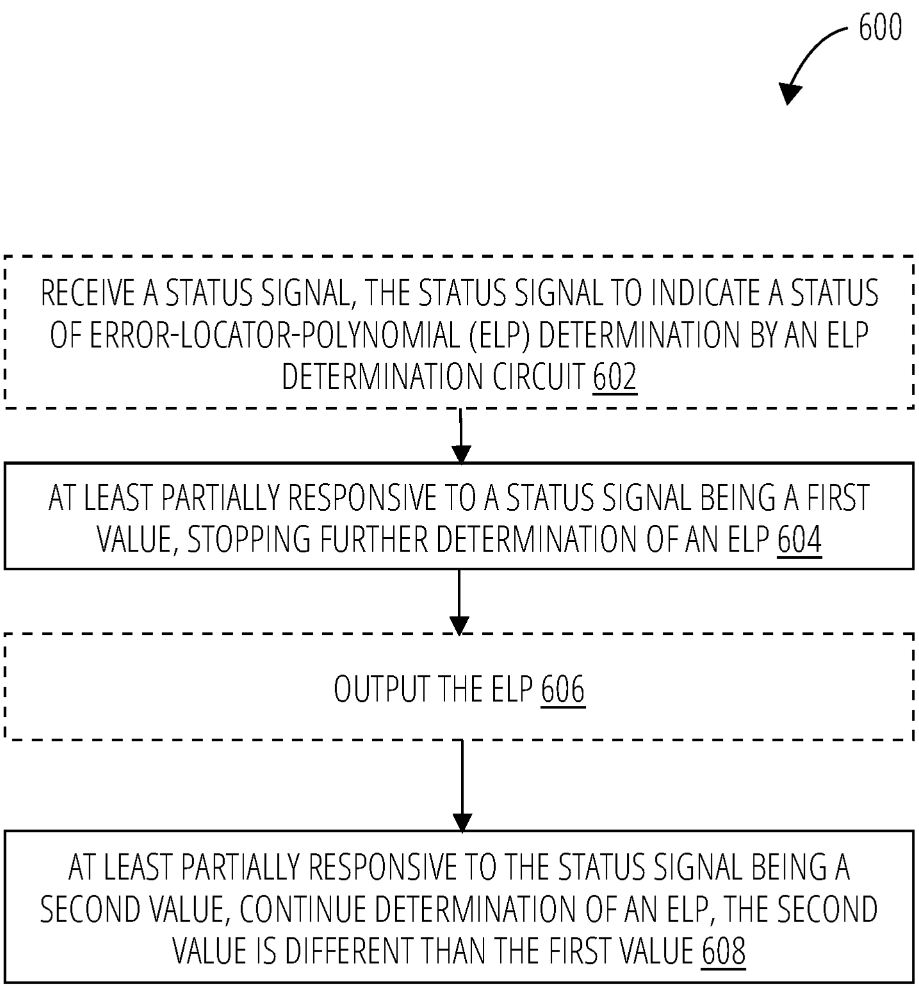
FIG. 6 is a flowchart depicting a process for controlling an ELP determination in accordance with one or more examples.

FIG. 6 is a flowchart depicting a process 600 for controlling an ELP determination in accordance with one or more examples.

Although the example process 600 depicts a particular sequence of operations, the sequence may be altered without departing from the scope of the present disclosure. For example, some of the operations depicted may be performed in parallel or in a different sequence that does not materially affect the function of the process 600. In other examples, different components of an example device or system that implements the process 600 may perform functions at substantially the same time or in a specific sequence. Some or a totality of operations of process 300 may be performed, as non-limiting examples, by one or more of apparatus 100, ELP determination circuit 102, exit condition logic 110, or state of ELP determination logic 104.

According to one or more examples, process 600 may include receiving a status signal, the status signal to indicate a status of error-locator-polynomial (ELP) determination by an ELP determination circuit at operation 602.

According to one or more examples, process 600 may include at least partially responsive to a status signal being a first value, stopping further determination of an ELP at operation 604.

According to one or more examples, the method includes outputting the ELP at operation 606.

According to one or more examples, process 600 may include at least partially responsive to the status signal being a second value, continue determination of an ELP, the second value is different than the first value at operation 608.

Figure 7:
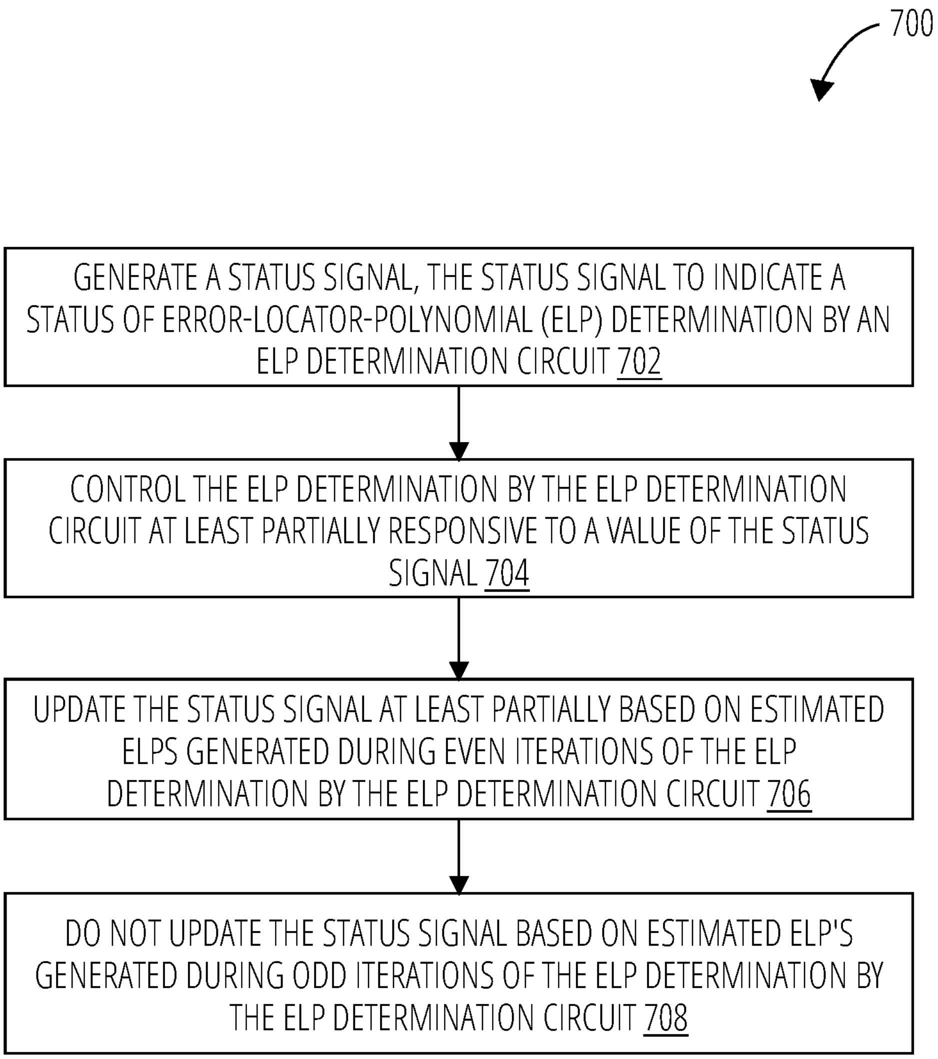
FIG. 7 illustrates an example process for controlling an ELP determination in accordance with one or more examples.

FIG. 7 illustrates an example process 700 for controlling an ELP determination in accordance with one or more examples.

Although the example process 700 depicts a particular sequence of operations, the sequence may be altered without departing from the scope of the present disclosure. For example, some of the operations depicted may be performed in parallel or in a different sequence that does not materially affect the function of the process 700. In other examples, different components of an example device or system that implements the process 700 may perform functions at substantially the same time or in a specific sequence. Some or a totality of operations of process 300 may be performed, as non-limiting examples, by one or more of apparatus 100, ELP determination circuit 102, exit condition logic 110, or state of ELP determination logic 104.

According to one or more examples, process 700 may include generating a status signal, the status signal to indicate a status of error-locator-polynomial (ELP) determination by an ELP determination circuit at operation 702.

According to one or more examples, process 700 may include controlling the ELP determination by the ELP determination circuit at least partially responsive to a value of the status signal at operation 704.

According to one or more examples, process 700 may include updating the status signal at least partially based on estimated ELPs generated during even iterations of the ELP determination by the ELP determination circuit, at operation 706.

According to one or more examples, process 700 may include not updating the status signal based on estimated ELP's generated during odd iterations of the ELP determination by the ELP determination circuit, at operation 708. In one or more examples, estimated ELPs determined during odd iterations of the Berlekamp algorithm are not utilized to determine the state of an ELP determination, by way of non-limiting example, not provided by ELP determination circuit 102 to early exit logic circuit 122 of FIG. 1.

In one or more examples, updating the status signal on even iterations refers to updating the status signal based on versions of the estimated ELP determined during even iterations of the ELP determination. By way of non-limiting example, even iterations may correspond to even iterations of a for-loop executed by the ELP determination circuit 102, or even iterations of a clock cycle. No updating of the status signal occurs (e.g., is skipped or omitted, without limitation) based on versions of the estimated ELP determined during odd iterations of the ELP determination.

If a block has e errors (where 'e' is an integer), then the ELP generation process will take exactly 2*e iterations of the Berlekamp algorithm to complete. At that point, the polynomial order (degree) will be e and will have e+1 terms (coefficients). So, a correct ELP occurs on even cycles of Berlekamp algorithm, as such process 700 updates the status signal and/or verifies the early exit condition on even iterations of the Berlekamp algorithm. Estimated ELPs generated during even iterations of the ELP determination are utilized to update the status signal or check the early exit condition, and estimated ELPs generated during odd iterations of the ELP determination are not utilized to update the status signal or check the early exit condition. The estimated ELP generated during event iterations of the ELP determination may be utilized to determine and update the status signal while the next, odd iteration of the Berlekamp algorithm occurs.

Figure 8:
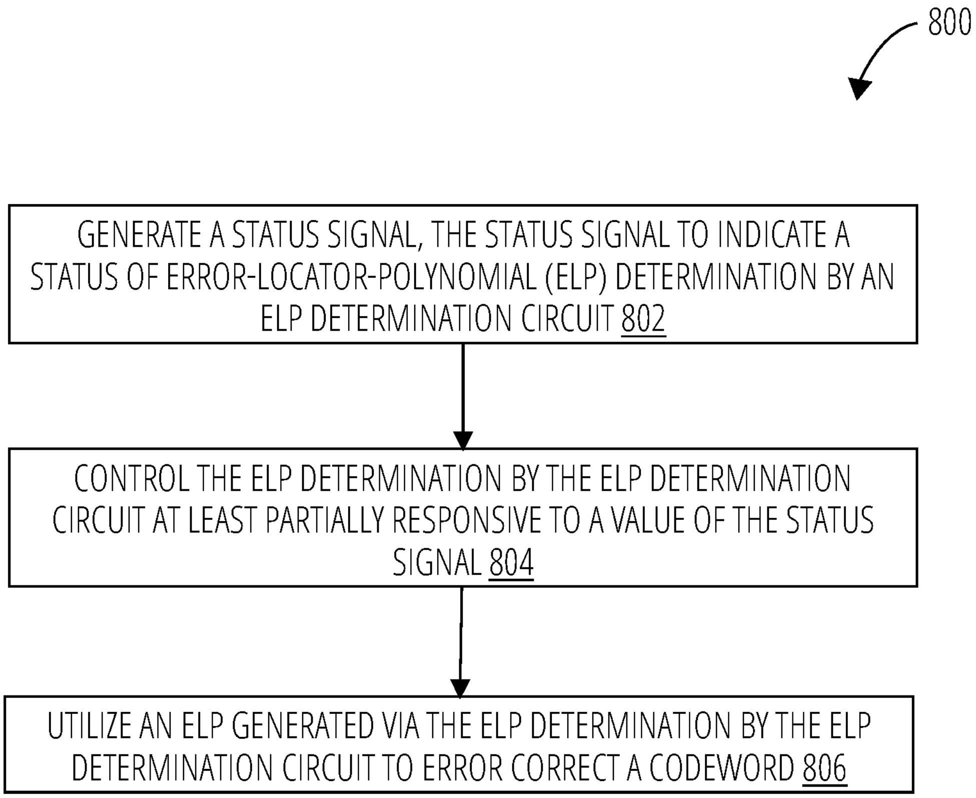
FIG. 8 illustrates an example process for error correcting a codeword, in accordance with one or more examples.

FIG. 8 illustrates an example process 800 for error correcting a codeword, in accordance with one or more examples.

Although the example process 800 depicts a particular sequence of operations, the sequence may be altered without departing from the scope of the present disclosure. For example, some of the operations depicted may be performed in parallel or in a different sequence that does not materially affect the function of the process 800. In other examples, different components of an example device or system that implements the process 800 may perform functions at substantially the same time or in a specific sequence. Some or a totality of operations of process 800 may be performed, as non-limiting examples, by one or more of apparatus 100, ELP determination circuit 102, exit condition logic 110, state of ELP determination logic 104, or decoder 900.

According to one or more examples, process 800 may include generating a status signal, the status signal to indicate a status of error-locator-polynomial (ELP) determination by an ELP determination circuit at operation 802.

According to one or more examples, process 800 may include controlling the ELP determination by the ELP determination circuit at least partially responsive to a value of the status signal at operation 804.

According to one or more examples, process 800 may include utilizing an ELP generated via the ELP determination by the ELP determination circuit to error correct a code word at operation 806.

Figure 9:
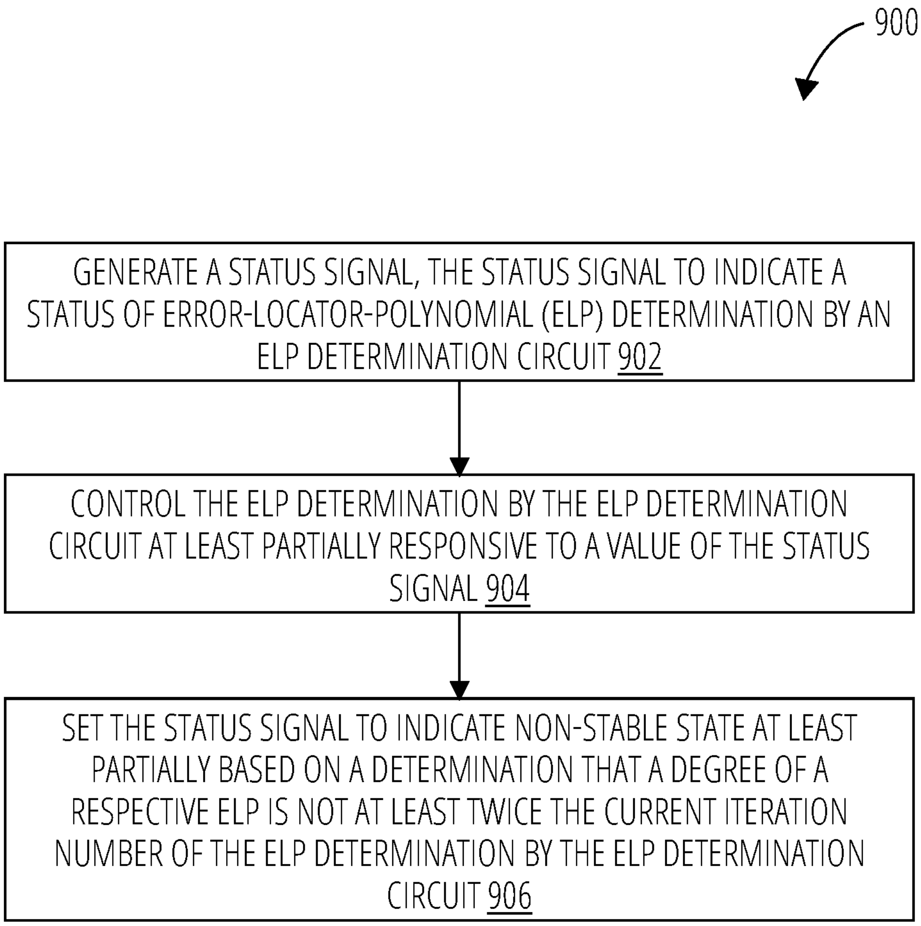
FIG. 9 is a block diagram depicting an RS decoder for Reed-Solomon decoding that offers early exit from ELP determination, in accordance with one or more examples.

FIG. 9 illustrates an example process 90, in accordance with one or more examples.

Although the example process 900 depicts a particular sequence of operations, the sequence may be altered without departing from the scope of the present disclosure. For example, some of the operations depicted may be performed in parallel or in a different sequence that does not materially affect the function of the process 900. In other examples, different components of an example device or system that implements the process 900 may perform functions at substantially the same time or in a specific sequence.

According to one or more examples, process 900 may include generating a status signal, the status signal to indicate a status of error-locator-polynomial (ELP) determination by an ELP determination circuit at operation 902.

According to one or more examples, process 900 may include controlling the ELP determination by the ELP determination circuit at least partially responsive to a value of the status signal at operation 904. Controlling the ELP determination may include exiting early or continuing an ELP determination as discussed above.

According to one or more examples, process 900 may include setting the status signal to indicate non-stable state at least partially based on a determination that a degree of a respective ELP is not at least twice the current iteration number of the ELP determination circuit at operation 906. Generally speaking, degree of a correct ELP should be at least twice the iteration number and if it is not then, in one or more examples, ELP state determination logic may determine that the status of the current ELP determination is a non-stable state and set the value of the status signal accordingly.

Figure 10:
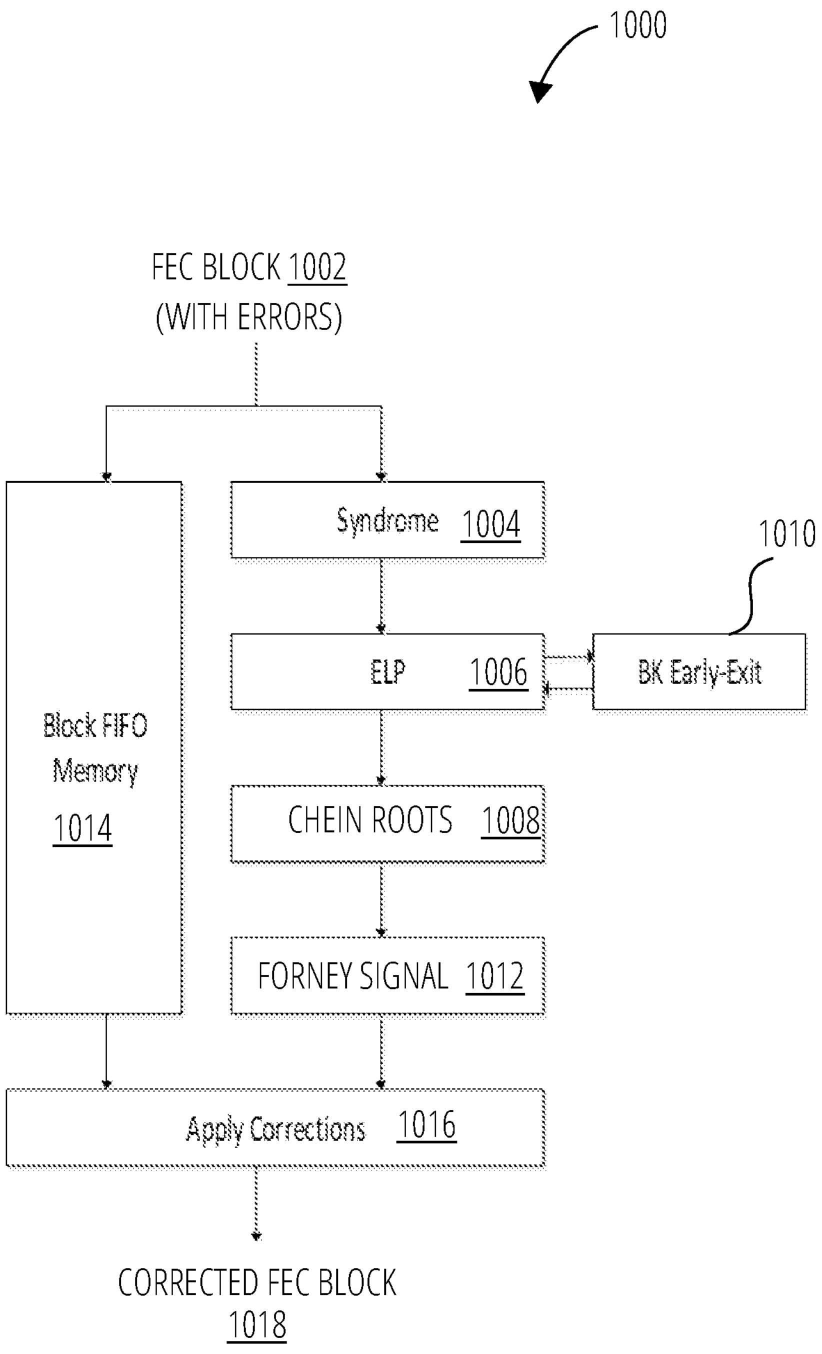
FIG. 10 illustrates a process in accordance with one or more examples.

FIG. 10 is a functional block diagram depicting a system 1000 for Reed-Solomon decoding that offers early exit from ELP determination, in accordance with one or more examples. System 1000 may also be referred to herein as a Reed-Solomon decoder 1000 or RS decoder 1000. The system depicted in FIG. 10 may be used in Chaudhuri-Hocquenghem decoding or other decoding based on polynomial arithmetic with modifications that would be apparent to a person having ordinary skill in the art apprised of this disclosure.

An FEC BLOCK 1002 with errors (e.g., bit-errors, symbol errors, burst errors, without limitation) is received at a first-in-first-out (FIFO) memory 1014 ("Block FIFO Memory 1014"). At the same time, syndrome 1004 is calculated at least partially based on FEC BLOCK 1002. The FIFO memory accumulates future FEC blocks since the processing time for respective FEC blocks may be different, where those with fewer errors take few clock cycles and those with many errors will take more clock cycles. While slow FEC blocks (i.e., ones with higher numbers of errors) are processing the FIFO memory can still receive other FEC blocks. The output rate of the decoder is higher than the total input rate due to the early exit. This allows the decoder 1000 to drain the FIFO memory even while new blocks are arriving at the input. Note the assumption here is that almost all input blocks have 0 or perhaps 1 symbol errors and that those blocks with high error counts are also rare in an electronic communication or storage system.

An ELP 1006 is determined at least partially based on syndrome 1004 and a BK Early-Exit signal 1010. The BK Early-Exit signal 1010 may be, as a non-limiting examples, a status signal 106 discussed above, or a signal generated by exit condition logic 110 to stop an ELP determination.

A Chein roots 1008 are generated at least partially based on the ELP 1006. The Chein roots 1008 are roots of the ELP 1006 determined utilizing a Chein search algorithm.

A Forney magnitude signal 1012 is generated at least partially based on the Chein roots 1008. The Forney magnitude signal 1012 may be determined based on Forney's Algorithm. The value of the Forney magnitude signal 1012 represents the magnitude of the errors at the locations indicated by the Chein roots 1008. In one or more examples, Forney magnitude signal 1012 may be determined at least partially based on the Chein roots 1008, syndrome 1004, and an Error Magnitude Polynomial. The corrections represented by one or more of the Forney signal 1012, Chein roots 1008, ELP 1006 or syndrome 1004 are applied at block 1016 to produce output blocks that include corrected FEC block 1018.

Figure 11:
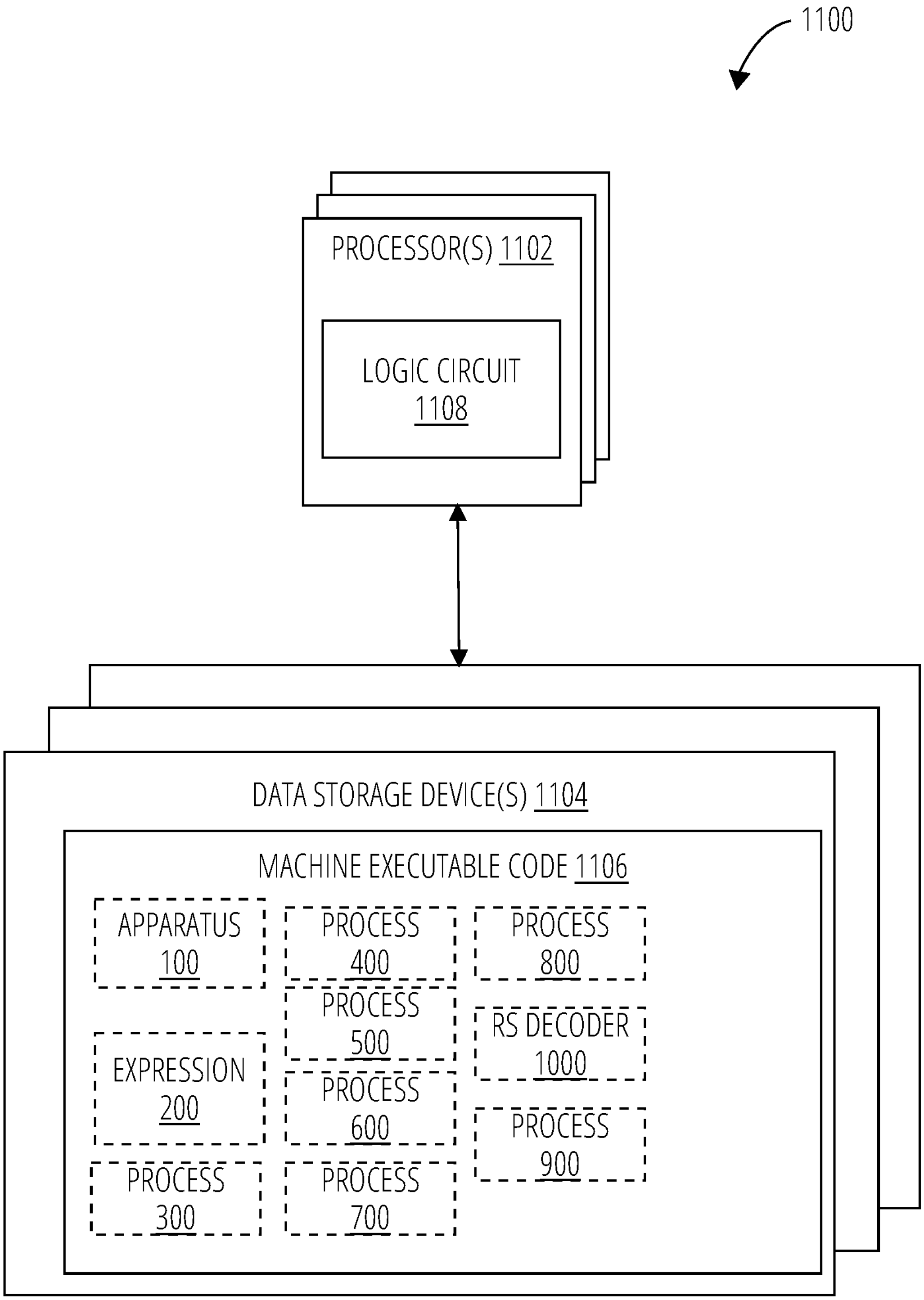
FIG. 11 is a block diagram of circuitry that, in some examples, may be used to implement various functions, operations, acts, processes, or methods disclosed herein.

It will be appreciated by those of ordinary skill in the art that functional elements of examples disclosed herein (e.g., functions, operations, acts, processes, or methods) may be implemented in any suitable hardware, software, firmware, or combinations thereof. FIG. 11 illustrates non-limiting examples of implementations of functional elements disclosed herein. In some examples, some or all portions of the functional elements disclosed herein may be performed by hardware specially configured for carrying out the functional elements.

FIG. 11 is a block diagram of a circuitry 1100 that, in some examples, may be used to implement various functions, operations, acts, processes, or methods disclosed herein. The circuitry 1100 includes one or more processors 1102 (sometimes referred to herein as "processors 1102") operably coupled to one or more data storage devices 1104 (sometimes referred to herein as "storage 1104"). The storage 1104 includes machine executable code 1106 stored thereon and the processors 1102 include logic circuit 1108. The machine executable code 1106 information describing functional elements that may be implemented by (e.g., performed by) the logic circuit 1108. The logic circuit 1108 is adapted to implement (e.g., perform) the functional elements described by the machine executable code 1106. The circuitry 1100, when executing the functional elements described by the machine executable code 1106, should be considered as special purpose hardware configured for carrying out functional elements disclosed herein. In some examples the processors 1102 may be configured to perform the functional elements described by the machine executable code 1106 sequentially, concurrently (e.g., on one or more different hardware platforms), or in one or more parallel process streams.

When implemented by logic circuit 1108 of the processors 1102, the machine executable code 1106 is configured to adapt the processors 1102 to perform operations of examples disclosed herein. By way of non-limiting example, the machine executable code 1106 may be configured to adapt the processors 1102 to perform some or a totality of operations of apparatus 100, expression 200, process 300, process 400, process 500, process 600, process 700, process 800, RS decoder 1000, or process 900.

The processors 1102 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device (PLD), discrete gate or transistor logic, discrete hardware components, other programmable device, or any combination thereof designed to perform the functions disclosed herein. A general-purpose computer including one or more processors 1102 is considered a special-purpose computer at least while the general-purpose computer executes functional elements corresponding to the machine executable code 1106 (e.g., software code, firmware code, configuration data, hardware descriptions, without limitation) related to examples of the present disclosure. t is noted that a general-purpose processor (which may also be referred to herein as a host processor or simply a "host") may be a microprocessor, but in the alternative, a general-purpose processor of processors 1102 may include any conventional processor, controller, microcontroller, or state machine. An FPGA or other PLD of the processors 1102 may be configured (e.g., programmed, without limitation) with configuration data to perform functions disclosed herein, or, additionally or alternatively, may be capable of being configured or re-configured (e.g., programmable, or re-programmable, without limitation) with configuration data to perform functions disclosed herein. The processors 1102 may also be implemented as a combination of computing devices, such as a combination of a DSP and a microprocessor, a plurality of microprocessors, one or more microprocessors in conjunction with a DSP core, or any other such configuration.

In some examples the storage 1104 includes volatile data storage (e.g., random-access memory (RAM)), non-volatile data storage (e.g., Flash memory, a hard disc drive, a solid state drive, erasable programmable read-only memory (EPROM), without limitation). In some examples the processors 1102 and the storage 1104 may be implemented into a single device (e.g., a semiconductor device product, a system on chip (SOC), without limitation). In some examples the processors 1102 and the storage 1104 may be implemented into separate devices.

In some examples the machine executable code 1106 may include computer-readable instructions (e.g., software code, firmware code). By way of non-limiting example, the computer-readable instructions may be stored by the storage 1104, accessed directly by the processors 1102, and executed by the processors 1102 using at least the logic circuit 1108. Also by way of non-limiting example, the computer-readable instructions may be stored on the storage 1104, transferred to a memory device (not shown) for execution, and executed by the processors 1102 using at least the logic circuit 1108. Accordingly, in some examples the logic circuit 1108 includes electrically configurable logic circuit 1108.

In some examples the machine executable code 1106 may describe hardware (e.g., circuitry) to be implemented in the logic circuit 1108 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, Verilog, System Verilog™ or very-large scale integration (VLSI) hardware description language (VHDL) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuit 1108 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some examples the machine executable code 1106 may include an HDL, an RTL, a GL description, a mask level description, other hardware description, or any combination thereof.

In examples where the machine executable code 1106 includes a hardware description (at any level of abstraction), a system (not shown, but including the storage 1104) may be configured to implement the hardware description described by the machine executable code 1106. By way of non-limiting example, the processors 1102 may include a programmable logic device (e.g., an FPGA or a PLC) and the logic circuit 1108 may be electrically controlled to implement circuitry corresponding to the hardware description into the logic circuit 1108. Also by way of non-limiting example, the logic circuit 1108 may include hard-wired logic manufactured by a manufacturing system (not shown, but including the storage 1104) according to the hardware description of the machine executable code 1106.

Regardless of whether the machine executable code 1106 includes computer-readable instructions or a hardware description, the logic circuit 1108 is adapted to perform the functional elements described by the machine executable code 1106 when implementing the functional elements of the machine executable code 1106. It is noted that although a hardware description may not directly describe functional elements, a hardware description indirectly describes functional elements that the hardware elements described by the hardware description are capable of performing.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, without limitation) of the computing system. In some examples, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims, without limitation) are generally intended as "open" terms (e.g., the term "including" should be interpreted as "including, but not limited to," the term "having" should be interpreted as "having at least," the term "includes" should be interpreted as "includes, but is not limited to," without limitation). As used herein, the term "each" means "some or a totality." As used herein, the term "each and every" means a "totality."

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more," without limitation); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations, without limitation). Furthermore, in those instances where a convention analogous to "at least one of A, B, and C, without limitation" or "one or more of A, B, and C, without limitation" is used, in general such a construction is intended to include A alone, B alone, C alone, A and B together, A and C together, B and C together, or A, B, and C together, without limitation.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional non-limiting examples include:

Example 1: An apparatus, comprising: an Error-Locator-Polynomial (ELP) determination circuit; and a logic circuit to set a status signal, the status signal to indicate a status of ELP determination by the ELP determination circuit, wherein the ELP determination circuit to: stop ELP determination at least partially responsive to a first value of the status signal; and continue ELP determination at least partially responsive to a second value of the status signal, wherein the second value different than the first value.

Example 2: The apparatus according to Example 1, wherein the logic circuit to: determine the status of ELP determination at least partially based on a respective ELP generated by the ELP determination circuit and a vector of syndromes; and set the status signal at least partially based on the determined status of ELP determination.

Example 3: The apparatus according to any of Examples 1 and 2, wherein the logic circuit to: determine Berlekamp discrepancy values utilizing ELPs generated by the ELP determination circuit and a vector of syndromes; and determine the status of ELP determination at least partially based on the determined Berlekamp discrepancy values.

Example 4: The apparatus according to any of Examples 1 through 3, wherein the logic circuit to: determine that the status of ELP determination is a stable state at least partially based on a totality of determined Berlekamp discrepancy values being zero for a respective ELP and the vector of syndromes; and determine that the status of ELP determination is a non-stable state at least partially based on at least one determined Berlekamp discrepancy value being non-zero for the respective ELP and the vector of syndromes.

Example 5: The apparatus according to any of Examples 1 through 4, wherein the logic circuit to: set the status signal to the first value to indicate the stable state; and set the status signal to the second value to indicate the non-stable state.

Example 6: The apparatus according to any of Examples 1 through 5, wherein the ELP determination circuit to: at least partially responsive to the status signal being the first value: stop further determination of an ELP; and provide the ELP, and at least partially responsive to the status signal being the second value: continue determination of the ELP.

Example 7: The apparatus according to any of Examples 1 through 6, wherein the logic circuit includes two or more sub-logic circuits to respectively determine Berlekamp discrepancy values utilizing an ELP generated by the ELP determination circuit and respective syndromes.

Example 8: The apparatus according to any of Examples 1 through 7, wherein the two or more sub-logic circuits to determine respective Berlekamp discrepancy values within a same clock cycle.

Example 9: The apparatus according to any of Examples 1 through 8, wherein the logic circuit to: update the status signal on even iterations of an ELP determination by the ELP determination circuit.

Example 10: The apparatus according to any of Examples 1 through 9, wherein the logic circuit to: not update the status signal on odd iterations of an ELP determination by the ELP determination circuit.

Example 11: The apparatus according to any of Examples 1 through 10, wherein the logic circuit to: set the status signal to indicate non-stable state at least partially based on a determination that a degree of a respective ELP is not at least twice the current iteration number of the ELP determination by the ELP determination circuit.

Example 12: A method, comprising: generating a status signal, the status signal to indicate a status of Error-Locator-Polynomial (ELP) determination by an ELP determination circuit; and controlling the ELP determination by the ELP determination circuit at least partially responsive to a value of the status signal.

Example 13: The method according to Example 12, comprising: determining the status of an ELP determination at least partially based on a respective ELP generated by the ELP determination circuit and a vector of syndromes; and setting the status signal at least partially based on the determined status of the ELP determination.

Example 14: The method according to any of Examples 12 and 13, comprising: determining Berlekamp discrepancy values at least partially based on a respective ELP generated by the ELP determination circuit and a vector of syndromes; and determining the status of ELP determination at least partially based on the determined Berlekamp discrepancy values.

Example 15: The method according to any of Examples 12 through 14, comprising: determining that the status of ELP determination is a stable state at least partially based on a totality of determined Berlekamp discrepancy values being zero for a respective ELP and the vector of syndromes; and determining that the status of ELP determination is a non-stable state at least partially based on at least one determined Berlekamp discrepancy value being non-zero for the respective ELP and the vector of syndromes.

Example 16: The method according to any of Examples 12 through 15, comprising: setting the status signal to a first value to indicate the stable state; and setting the status signal to a second value to indicate the non-stable state, wherein the second value is different than the first value.

Example 17: The method according to any of Examples 12 through 16, comprising: at least partially responsive to the status signal being a first value: stopping further determination of an ELP; and outputting the ELP, and at least partially responsive to the status signal being a second value: continuing determination of an ELP, wherein the second value is different than the first value.

Example 18: The method according to any of Examples 12 through 17, comprising: determining, during a same clock cycle, two or more Berlekamp discrepancy values utilizing an ELP generated by the ELP determination circuit and respective syndromes.

Example 19: The method according to any of Examples 12 through 18, comprising: updating the status signal on even iterations of the ELP determination by the ELP determination circuit.

Example 20: The method according to any of Examples 12 through 19, comprising: utilizing an ELP generated via the ELP determination by the ELP determination circuit to error correct a code word.

Example 21: The method according to any of Examples 12 through 20, a method comprising: setting the status signal to indicate non-stable state at least partially based on a determination that a degree of a respective ELP is not at least twice the current iteration number of the ELP determination by the ELP determination circuit.

Example 22: A decoder for Reed-Solomon decoding or Bose-Chaudhuri-Hocquenghem decoding, the decoder comprising an Error-Locator-Polynomial (ELP) determination circuit, the ELP determination circuit to exit an ELP determination at least partially responsive to an indication that a respective ELP reached a stable state.

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. An apparatus, comprising:

an Error-Locator-Polynomial (ELP) determination circuit; and a logic circuit to set a status signal, the status signal to indicate a status of ELP determination by the ELP determination circuit, the logic circuit to set the status signal to a first value to indicate that the status of ELP determination is a stable state and to set the status signal to a second value to indicate that the status of ELP determination is a non-stable state, wherein the stable state being a condition in which no further changes to coefficients of the error-locator polynomial will occur in subsequent iterations of a current ELP determination, and the non-stable state being a condition in which further changes to coefficients of the error-locator polynomial could occur in subsequent iterations of the current ELP determination, wherein the ELP determination circuit to:

stop ELP determination at least partially responsive to the first value of the status signal; and continue ELP determination at least partially responsive to the second value of the status signal, wherein the second value different than the first value, wherein the logic circuit to:

determine Berlekamp discrepancy values utilizing ELPs generated by the ELP determination circuit and a vector of syndromes; and determine the status of ELP determination at least partially based on the determined Berlekamp discrepancy values.

2. The apparatus of claim 1, wherein the logic circuit to:

determine the status of ELP determination at least partially based on a respective ELP generated by the ELP determination circuit and a vector of syndromes; and set the status signal at least partially based on the determined status of ELP determination.

3. The apparatus of claim 1, wherein the logic circuit to:

determine that the status of ELP determination is a stable state at least partially based on a totality of determined Berlekamp discrepancy values being zero for a respective ELP and the vector of syndromes; and determine that the status of ELP determination is a non-stable state at least partially based on at least one determined Berlekamp discrepancy value being non-zero for the respective ELP and the vector of syndromes.

4. The apparatus of claim 3, wherein the logic circuit to:

set the status signal to the first value to indicate the stable state; and set the status signal to the second value to indicate the non-stable state.

5. The apparatus of claim 1, wherein the ELP determination circuit to:

at least partially responsive to the status signal being the first value:

provide the ELP.

6. An apparatus, comprising:

an Error-Locator-Polynomial (ELP) determination circuit; and a logic circuit to set a status signal, the status signal to indicate a status of ELP determination by the ELP determination circuit, the logic circuit to set the status signal to a first value to indicate that the status of ELP determination is a stable state and to set the status signal to a second value to indicate that the status of ELP determination is a non-stable state, wherein the stable state being a condition in which no further changes to coefficients of the error-locator polynomial will occur in subsequent iterations of a current ELP determination, and the non-stable state being a condition in which further changes to coefficients of the error-locator polynomial could occur in subsequent iterations of the current ELP determination, wherein the ELP determination circuit to:

stop ELP determination at least partially responsive to the first value of the status signal; and continue ELP determination at least partially responsive to the second value of the status signal, wherein the second value different than the first value, wherein the logic circuit includes two or more sub-logic circuits to respectively determine Berlekamp discrepancy values utilizing an ELP generated by the ELP determination circuit and respective syndromes.

7. The apparatus of claim 6, wherein the two or more sub-logic circuits to determine respective Berlekamp discrepancy values within a same clock cycle.

8. An apparatus, comprising:

an Error-Locator-Polynomial (ELP) determination circuit; and a logic circuit to set a status signal, the status signal to indicate a status of ELP determination by the ELP determination circuit, the logic circuit to set the status signal to a first value to indicate that the status of ELP determination is a stable state and to set the status signal to a second value to indicate that the status of ELP determination is a non-stable state, wherein the stable state being a condition in which no further changes to coefficients of the error-locator polynomial will occur in subsequent iterations of a current ELP determination, and the non-stable state being a condition in which further changes to coefficients of the error-locator polynomial could occur in subsequent iterations of the current ELP determination, wherein the ELP determination circuit to:

stop ELP determination at least partially responsive to the first value of the status signal; and continue ELP determination at least partially responsive to the second value of the status signal, wherein the second value different than the first value, wherein the logic circuit to:

update the status signal on even iterations of an ELP determination by the ELP determination circuit.

9. An apparatus, comprising:

an Error-Locator-Polynomial (ELP) determination circuit; and a logic circuit to set a status signal, the status signal to indicate a status of ELP determination by the ELP determination circuit, the logic circuit to set the status signal to a first value to indicate that the status of ELP determination is a stable state and to set the status signal to a second value to indicate that the status of ELP determination is a non-stable state, wherein the stable state being a condition in which no further changes to coefficients of the error-locator polynomial will occur in subsequent iterations of a current ELP determination, and the non-stable state being a condition in which further changes to coefficients of the error-locator polynomial could occur in subsequent iterations of the current ELP determination, wherein the ELP determination circuit to:

stop ELP determination at least partially responsive to the first value of the status signal; and continue ELP determination at least partially responsive to the second value of the status signal, wherein the second value different than the first value, wherein the logic circuit to:

not update the status signal on odd iterations of an ELP determination by the ELP determination circuit.

10. An apparatus, comprising:

an Error-Locator-Polynomial (ELP) determination circuit; and a logic circuit to set a status signal, the status signal to indicate a status of ELP determination by the ELP determination circuit, the logic circuit to set the status signal to a first value to indicate that the status of ELP determination is a stable state and to set the status signal to a second value to indicate that the status of ELP determination is a non-stable state, wherein the stable state being a condition in which no further changes to coefficients of the error-locator polynomial will occur in subsequent iterations of a current ELP determination, and the non-stable state being a condition in which further changes to coefficients of the error-locator polynomial could occur in subsequent iterations of the current ELP determination, wherein the ELP determination circuit to:

stop ELP determination at least partially responsive to the first value of the status signal; and continue ELP determination at least partially responsive to the second value of the status signal, wherein the second value different than the first value, wherein the logic circuit to:

set the status signal to indicate non-stable state at least partially based on a determination that a degree of a respective ELP is not at least twice the current iteration number of the ELP determination by the ELP determination circuit.

11. A method, comprising:

generating a status signal, the status signal to indicate a status of Error-Locator-Polynomial (ELP) determination by an ELP determination circuit, wherein generating the status signal comprises setting the status signal to one of: a first value to indicate that the status of ELP determination is a stable state, or to a second value to indicate that the status of ELP determination is a non-stable state, the first value different than the second value, wherein the stable state being a condition in which no further changes to coefficients of the error-locator polynomial will occur in subsequent iterations of a current ELP determination, and the non-stable state being a condition in which further changes to coefficients of the error-locator polynomial could occur in subsequent iterations of the current ELP determination;

controlling the ELP determination by the ELP determination circuit at least partially responsive to a value of the status signal;

determining Berlekamp discrepancy values at least partially based on a respective ELP generated by the ELP determination circuit and a vector of syndromes; and determining the status of ELP determination at least partially based on the determined Berlekamp discrepancy values.

12. The method claim 11, comprising:

determining the status of an ELP determination at least partially based on a respective ELP generated by the ELP determination circuit and a vector of syndromes; and setting the status signal at least partially based on the determined status of the ELP determination.

13. The method of claim 11, comprising:

determining that the status of ELP determination is a stable state at least partially based on a totality of determined Berlekamp discrepancy values being zero for a respective ELP and the vector of syndromes; and determining that the status of ELP determination is a non-stable state at least partially based on at least one determined Berlekamp discrepancy value being non-zero for the respective ELP and the vector of syndromes.

14. The method of claim 13, comprising:

setting the status signal to a first value to indicate the stable state; and setting the status signal to a second value to indicate the non-stable state, wherein the second value is different than the first value.

15. The method of claim 11, comprising:

at least partially responsive to the status signal being a first value:

outputting the ELP.

16. The method of claim 11, comprising:

utilizing an ELP generated via the ELP determination by the ELP determination circuit to error correct a code word.

17. A method, comprising:

generating a status signal, the status signal to indicate a status of Error-Locator-Polynomial (ELP) determination by an ELP determination circuit, wherein generating the status signal comprises setting the status signal to one of: a first value to indicate that the status of ELP determination is a stable state, or to a second value to indicate that the status of ELP determination is a non-stable state, the first value different than the second value, wherein the stable state being a condition in which no further changes to coefficients of the error-locator polynomial will occur in subsequent iterations of a current ELP determination, and the non-stable state being a condition in which further changes to coefficients of the error-locator polynomial could occur in subsequent iterations of the current ELP determination;

controlling the ELP determination by the ELP determination circuit at least partially responsive to a value of the status signal; and determining, during a same clock cycle, two or more Berlekamp discrepancy values utilizing an ELP generated by the ELP determination circuit and respective syndromes.

18. A method, comprising:

generating a status signal, the status signal to indicate a status of Error-Locator-Polynomial (ELP) determination by an ELP determination circuit, wherein generating the status signal comprises setting the status signal to one of: a first value to indicate that the status of ELP determination is a stable state, or to a second value to indicate that the status of ELP determination is a non-stable state, the first value different than the second value, wherein the stable state being a condition in which no further changes to coefficients of the error-locator polynomial will occur in subsequent iterations of a current ELP determination, and the non-stable state being a condition in which further changes to coefficients of the error-locator polynomial could occur in subsequent iterations of the current ELP determination;

controlling the ELP determination by the ELP determination circuit at least partially responsive to a value of the status signal; and updating the status signal on even iterations of the ELP determination by the ELP determination circuit.

19. A method, comprising:

generating a status signal, the status signal to indicate a status of Error-Locator-Polynomial (ELP) determination by an ELP determination circuit, wherein generating the status signal comprises setting the status signal to one of: a first value to indicate that the status of ELP determination is a stable state, or to a second value to indicate that the status of ELP determination is a non-stable state, the first value different than the second value, wherein the stable state being a condition in which no further changes to coefficients of the error-locator polynomial will occur in subsequent iterations of a current ELP determination, and the non-stable state being a condition in which further changes to coefficients of the error-locator polynomial could occur in subsequent iterations of the current ELP determination;

controlling the ELP determination by the ELP determination circuit at least partially responsive to a value of the status signal; and setting the status signal to indicate non-stable state at least partially based on a determination that a degree of a respective ELP is not at least twice the current iteration number of the ELP determination by the ELP determination circuit.

20. A decoder for Reed-Solomon decoding or Bose-Chaudhuri-Hocquenghem decoding, the decoder comprising:

an Error-Locator-Polynomial (ELP) determination circuit, the ELP determination circuit to exit an ELP determination at least partially responsive to an indication that a respective ELP reached a stable state, the stable state being a condition in which no further changes to coefficients of an error-locator polynomial will occur in subsequent iterations of the ELP determination, wherein the indication is at least partially based on a totality of determined Berlekamp discrepancy values being zero for the respective ELP and a vector of syndromes.

* * * * *